(12) United States Patent
Le Guillou et al.

(10) Patent No.: US 7,629,912 B2
(45) Date of Patent: Dec. 8, 2009

(54) ANALOG-TO-DIGITAL CONVERTER OF THE SIGMA DELTA TYPE

(75) Inventors: Yann Le Guillou, Caen (FR); Herve Marie, Van sur Mer (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/096,218

(22) PCT Filed: Dec. 4, 2006

(86) PCT No.: PCT/IB2006/054582

§ 371 (c)(1),
(2), (4) Date: Jun. 5, 2008

(87) PCT Pub. No.: WO2007/066275

PCT Pub. Date: Jun. 14, 2007

(65) Prior Publication Data

US 2008/0309536 A1    Dec. 18, 2008

(30) Foreign Application Priority Data

Dec. 6, 2005    (EP) ................................ 05301014

(51) Int. Cl.
*H03M 3/00* (2006.01)
(52) U.S. Cl. ...................................... 341/143; 341/155
(58) Field of Classification Search .......... 341/143–155
See application file for complete search history.

(56) References Cited

U.S. PATENT DOCUMENTS 5,587,708 A * 12/1996 Chiu ........................... 341/76
6,570,518 B2 * 5/2003 Riley et al. ................. 341/143

FOREIGN PATENT DOCUMENTS

GB    2266203 A    10/1993

\* cited by examiner

*Primary Examiner*—Lam T Mai (57) ABSTRACT

An analog-to-digital converter (ADC1) of the Sigma Delta type provides a stream of digital output samples (OUT) in response to an analog input signal (IN). The analog-to-digital converter (ADC1) comprises a quantizer (QNT) that has a dead zone. The quantizer (QNT) provides a digital output sample that has a neutral value when the quantizer (QNT) receives an input signal whose amplitude is within the dead zone. A feedback path (DAC) within the analog-to-digital converter (ADC1) provides a feedback action only in response to a digital output sample that has a value other than the neutral value.

9 Claims, 6 Drawing Sheets

ANALOG-TO-DIGITAL CONVERTER OF THE SIGMA DELTA TYPE

FIELD OF THE INVENTION

An aspect of the invention relates to an analog-to-digital converter of the Sigma Delta type that provides a stream of digital output samples in response to an analog input signal. The analog-to-digital converter may form part of, for example, an integrated circuit that comprises other functional elements. Other aspects of the invention relate to a receiver, a method of controlling analog-to-digital converter, and a computer program product for a receiver that comprises an analog-to-digital converter.

DESCRIPTION OF PRIOR ART

The textbook "Continuous-Time Sigma-Delta Modulation for IF A/D Conversion in Radio Receivers" by L. J. Breems (ISBN ) relates to analog-to-digital converters of the Sigma Delta type. Basically, a Sigma-Delta modulator consists of a loop filter, which performs a noise-shaping, a low resolution quantizer, which is oversampled, and a feedback loop. The loop filter can be a low pass or a band pass filter. A first-order low pass filter is an accumulator in the discrete-time domain or an integrator in the continuous-time domain. More effective noise-shaping is achieved with a higher-order Sigma Delta modulator, which has more accumulator/integrator stages. High-frequency quantization noise is filtered out by a decimation filter behind the Sigma-Delta modulator.

SUMMARY OF THE INVENTION

According to an aspect of the invention, an analog-to-digital converter of the Sigma Delta type, which provides a stream of digital output samples in response to an analog input signal, has the following characteristics. The analog-to-digital converter comprises a quantizer that has a dead zone. The quantizer provides a digital output sample that has a neutral value when the quantizer receives an input signal whose amplitude is within the dead zone. A feedback path within the analog-to-digital converter provides a feedback action only in response to a digital output sample that has a value other than the neutral value.

The invention takes the following aspects into consideration. An analog-to-digital converter of the Sigma Delta type uses a clock signal to form a stream of digital output samples in response to an analog input signal. In practice, there will be jitter in the clock signal. Jitter is a form of time imprecision. Rising edges and falling edges in the clock signal do not exactly occur on a fixed time grid. An edge may occur somewhat sooner or somewhat later than desired in a random fashion. This cause causes random errors in the stream of digital output samples. That is, jitter in the clock signal will cause into noise in the output signal. Clock jitter deteriorates signal-to-noise ratio.

In accordance with the aforementioned aspect of the invention, an analog-to-digital converter of the Sigma Delta type comprises a quantizer that has a dead zone. The quantizer provides a digital output sample that has a neutral value when the quantizer receives an input signal whose amplitude is within the dead zone. A feedback path within the analog-to-digital converter provides a feedback action only in response to a digital output sample that has a value other than the neutral value. That is, there is no feedback action for a digital output sample that has the neutral value.

Due to the dead zone, there will be clock periods in the clock signal, each of which comprises a rising edge and a falling edge, which do not cause any feedback action. Only a percentage of the clock periods in the clock signal will cause a feedback action. The edges of the clock periods that coincide with a digital output sample that has the neutral value do not cause any feedback action. This prevents these edges from introducing random errors and, therefore, noise in the stream of digital output signals. As a result, the analog-to-digital converter is relatively insensitive to clock jitter. For those reasons, the invention allows a relatively good signal-to-noise ratio.

The following aspects further contribute to a relatively good signal-to-noise ratio. The neutral value constitutes an additional level of quantization. The greater the number of quantization levels is, the higher the signal-to-noise ratio that can be achieved for a given oversampling factor. For example, let it be assumed that an analog-to-digital converter in accordance with the invention provides three-level digital output samples, which can have the value "+1", "−1", or "0". The mere presence of the value "0", which is the neutral value, allows a signal-to-noise ratio improvement of approximately 5.2 decibels (dB) with respect to a conventional analog-to-digital converter of the Sigma Delta type that provides binary output samples, for which only two different values exist.

Another advantage of the invention relates to the following aspects. A clock signal that has a relatively low degree of jitteriness requires a careful design, in particular in integrated circuit implementations. The lower the degree of jitteriness that is required, the more complicated the design is and, therefore, the more costly the design is. Moreover, the lower the degree of jitteriness that is required, the more power clock circuits will consume and the larger these circuits will be. As explained hereinbefore, the invention allows an analog-to-digital converter of the Sigma Delta type that is relatively insensitive to jitter in the clock signal. Consequently, the clock signal that the analog-to-digital converter receives may have a higher degree of jitteriness compared with a conventional analog-to-digital converter. This relaxes design effort, reduces power consumption, and allows smaller clock circuits, which require occupy less chip area in integrated circuit implementations. For those reasons, the invention allows cost efficiency and, moreover, power efficiency.

The following aspects further contribute to cost efficiency. An analog-to-digital converter of the Sigma Delta type generally comprises a noise shaping filter. The signal-to-noise ratio of the analog-to-digital converter depends on the noise shaping filter. In general it holds that the higher the order of the noise shaping filter is, the better the signal-to-noise ratio is. It has been explained hereinbefore that the mere presence of the neutral value allows a signal-to-noise ratio improvement. Consequently, an analog-to-digital converter in accordance with the invention can provide a desired signal-to-noise ratio with a noise shaping filter of a lower order compared with a conventional analog-to-digital converter. The lower the order of the noise shaping filter is, the less complicated and, therefore, the less costly the noise shaping filter is.

These and other aspects of the invention will be described in greater detail hereinafter with reference to drawings.

DETAILED DESCRIPTION

Figure 1:
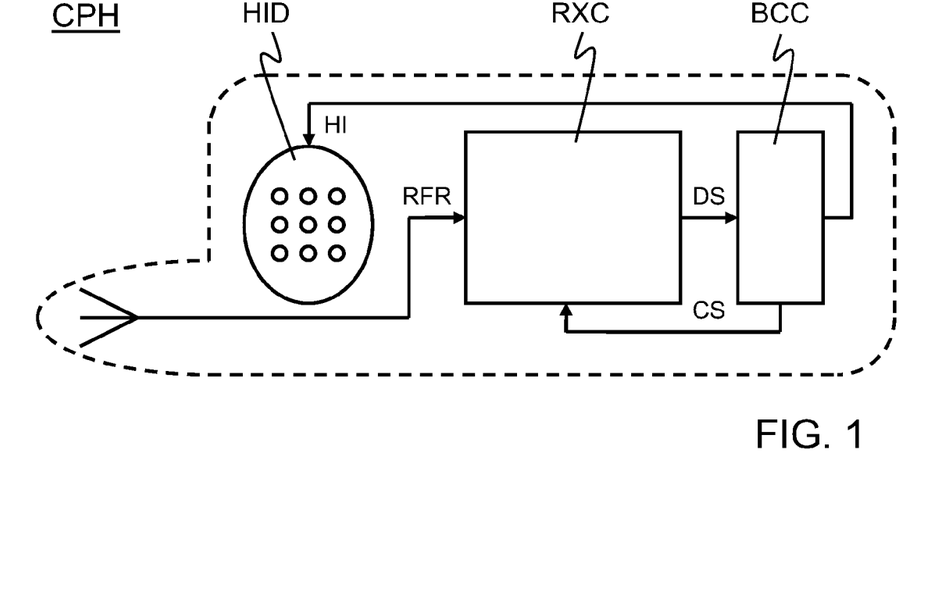
FIG. 1 is a block diagram that illustrates a cellular phone.

FIG. 1 illustrates a cellular phone CPH. The cellular phone CPH comprises a receiver circuit RXC, a processing-and-control circuit PCC, and human interface devices HID. The cellular phone CPH may further comprise a transmitter circuit, which FIG. 1 does not illustrate. The receiver circuit RXC and the transmitter circuit may share various components. The processing-and-control circuit PCC may comprise various different processors that have been suitably programmed. The human interface devices HID typically comprise a small loudspeaker, a small microphone, a display device, and a numerical keyboard for dialing a number.

The cellular phone CPH basically operates as follows. The receiver circuit RXC receives a radiofrequency spectrum RF via an antenna. The receiver circuit RXC derives a data signal DS from a particular communication channel within the radiofrequency spectrum RF. The data signal DS may comprise data from a calling party or data from a base station or another cellular-phone network entity, or any combination of such data. The processing-and-control circuit PCC processes the data signal DS so as to obtain one or more human-interface input signals HI. A human-interface input signal HI may be, for example, an audio signal for the small loudspeaker, which is one of the human interface devices HID. The processing-and-control circuit PCC applies control signals CS to the receiver circuit RXC so as to switch, for example, from one communication channel to another communication channel.

Figure 2:
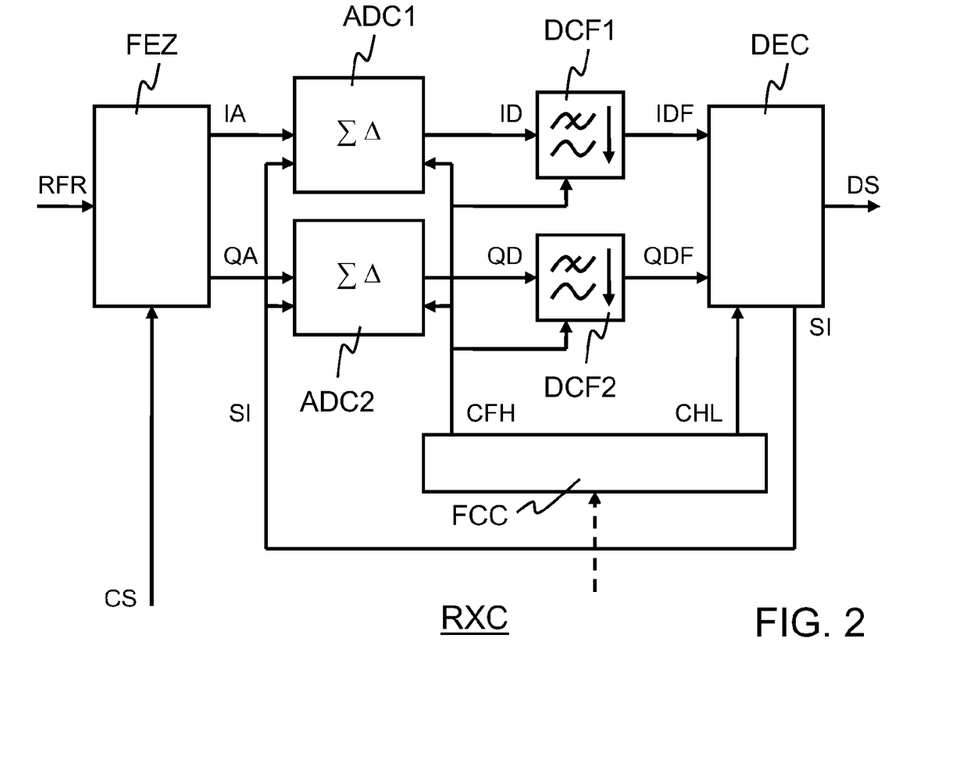
FIG. 2 is a block diagram that illustrates a receiver circuit, which forms part of the cellular phone.

FIG. 2 illustrates the receiver circuit RXC. The receiver circuit RXC comprises a front-end circuit FEC, two analog-to-digital converters ADC1, ADC2, two decimation filters DCF1, DCF2, and a quadrature-signal processing circuit QSP. The aforementioned elements form a signal processing path that derives the data signal DS from the radiofrequency spectrum RF, which the receiver circuit RXC receives from the antenna. The front-end circuit FEC is of the so-called direct conversion type. The two analog-to-digital converters ADC1, ADC2 are of the so-called Sigma Delta type. The quadrature-signal processing circuit QSP may be in the form of, for example, a suitably programmed digital signal processor. The receiver circuit RXC further comprises a clock frequency circuit CFC.

The receiver circuit RXC basically operates as follows. The front-end circuit FEC carries out a frequency conversion, which is accompanied by amplification and filtering. The front-end circuit FEC shifts the radiofrequency spectrum RF so that the particular communication channel, from which the data signal DS is derived, is substantially centered on a low intermediate frequency or even on "zero" frequency. The front-end circuit FEC provides an analog in-phase signal IA and an analog quadrature signal QA. These signals constitute a low intermediate-frequency representation, or even a zero frequency representation, of the particular communication channel from which the data signal DS is derived.

The two analog-to-digital converters ADC1, ADC2 convert the analog in-phase signal IA and the analog quadrature signal QA into a digital in-phase signal ID and a digital quadrature signal QD, respectively. The digital in-phase signal ID and the digital quadrature signal QD are three-level signals. Consequently, a sample of these signals can have a value among three possible values only. The two analog-to-digital converters ADC1, ADC2 receive a high-frequency clock signal CFH from the clock frequency circuit CFC. Accordingly, the digital in-phase signal ID and the digital quadrature signal QD have a relatively high sample rate.

The two decimation filters DCF1, DCF2 carry out a sample rate reduction, which involves a serial-to-parallel conversion. Decimation filter DCF1 converts a series of consecutive samples in the digital in-phase signal ID into a single N-bit in phase sample. N is an integer greater than 2. For example, N may be equal to 16, which corresponds to 256 possible different values. Accordingly, decimation filter DCF1 provides an N-bit in-phase signal IDF, which is a stream of N-bit in phase samples that result from respective serial-to-parallel conversions. The N-bit in-phase signal IDF has a relatively low sample rate. Similarly, decimation filter DCF2 converts a series of consecutive samples in the digital quadrature signal QD into a single N-bit quadrature sample. Accordingly, decimation filter DCF2 provides an N-bit quadrature signal QDF, which has a relatively low sample rate.

The two decimation filters DCF1, DCF2 have a filter function. The digital in-phase signal ID, which analog-to-digital converter ADC1 provides, comprises relatively much high frequency noise. This is typical for a Sigma Delta type analog-to-digital conversion. The high frequency noise lies outside a frequency band of interest, which comprises the zero frequency representation of the particular communication channel from which the data signal DS is derived. Decimation filter DCF1 attenuates the high frequency noise to a relatively great extent. The same applies to decimation filter DCF2, which attenuates the high frequency noise in the digital quadrature signal QD, which analog-to-digital converter ADC2 provides. Accordingly, the N-bit in-phase signal IDF and the N-bit quadrature signal QDF constitute a low noise digital zero frequency representation of the particular communication channel from which the data signal DS is derived.

The two decimation filters DCF1, DCF2 may further have a de-rotation function in case the digital in-phase signal ID and the digital quadrature signal QD constitute a low intermediate-frequency representation of the communication channel of interest. In that case, the digital in-phase signal ID and the digital quadrature signal QD comprise a low-intermediate frequency carrier, which can be seen a rotating vector. The de-rotation function shifts the aforementioned carrier to zero frequency; which removes the corresponding rotating vector. As a result, the N-bit in-phase signal IDF and the N-bit quadrature signal QDF will constitute a zero frequency representation of the communication channel of interest.

Analog-to-digital converter ADC1 and decimation filter DCF1 form a combination that is functionally equivalent to an N-bit analog-to-digital converter, which directly converts the analog in-phase signal IA into the N-bit in-phase signal IDF. Similarly, analog-to-digital converter ADC2 and decimation filter DCF2 form a combination that is functionally equivalent to an N-bit analog-to-digital converter, which directly converts the analog quadrature signal QA into the N-bit quadrature signal QDF.

The quadrature-signal processing circuit QSP derives the data signal DS from the N-bit in-phase signal IDF and the N-bit quadrature signal QDF. To that end, the quadrature-signal processing circuit QSP may carry out various functions such as, for example, filtering, equalizing, channel decoding, and symbol detection. The quadrature-signal processing circuit QSP receives a low-frequency clock signal CFL from the clock frequency circuit CFC. The low-frequency clock signal CFL may be equal to, for example, the sample rate of the N-bit in-phase signal IDF and the N-bit quadrature signal QDF. The quadrature-signal processing circuit QSP further derives a signal strength indication SI from the N-bit in-phase signal IDF and the N-bit quadrature signal QDF. The signal strength indication SI provides an indication of the respective magnitudes of the analog in-phase signal IA and the analog quadrature signal QA, which the two analog-to-digital converters ADC1, ADC2 receive, respectively. The signal strength indication SI preferably varies with the aforementioned respective magnitudes in accordance with a logarithmic function. In that case, a given change expressed in decibel (dB) units in the aforementioned respective magnitudes causes a given change in the signal strength indication SI in scalar units. For example, the signal strength indication SI increases 5 units in value when the respective magnitudes of the analog in-phase signal IA and the analog quadrature signal QA increase by +10 dB.

The two analog-to-digital converters ADC1, ADC2 receive the signal strength indication SI. Each analog-to-digital converter has a conversion characteristic that varies as a function of the signal strength indication SI. This will be explained in greater detail hereinafter.

The receiver circuit RXC provides a reception quality that depends to relatively large extent on the conversion characteristics of the two analog-to-digital converters ADC1, ADC2. The two analog-to-digital converters ADC1, ADC2 constitute an interface between analog signal processing, which takes place in the front-end circuit FEC, and digital signal processing, which takes place in the quadrature-signal processing circuit QSP and the processing-and-control circuit PCC illustrated in FIG. 1. Digital signal processing is relatively uncritical in terms of noise, distortion, and interference. A carefully designed digital signal processor generally does not introduce any noise or distortion and is insensitive to interference. The reception quality therefore substantially depends on noise and distortion that is present in the digital in-phase signal ID and the digital quadrature signal QD, which the two analog-to-digital converters ADC1, ADC2 provide. Ideally, the two analog-to-digital converters ADC1, ADC2 should not introduce any noise or distortion. In practice, the noise and distortion that the two analog-to-digital converters ADC1, ADC2 introduce should preferably be well below the noise and distortion that is already present in the analog in-phase signal IA and the analog quadrature signal QA.

Figure 3:
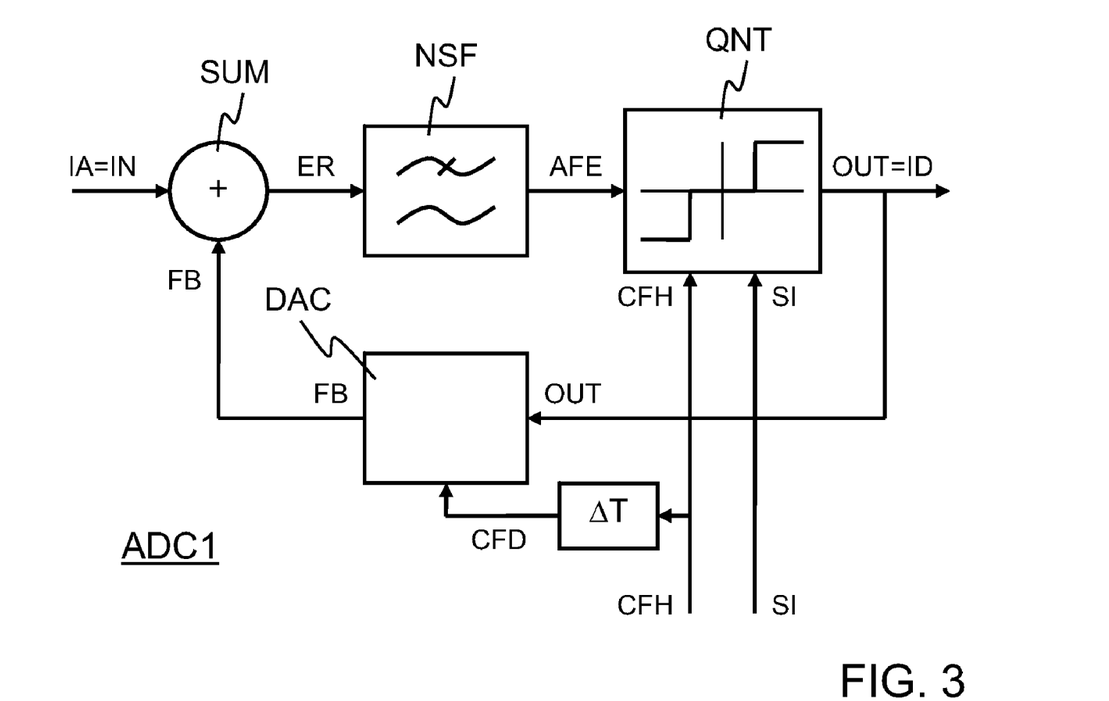
FIG. 3 is a block diagram that illustrates an analog-to-digital converter, which forms part of the receiver circuit.

FIG. 3 analog-to-digital converter ADC1, which is of the Sigma Delta type. Analog-to-digital converter ADC1 comprises a summing circuit SUM, a noise shaping filter NSF, a quantizer QNT, and a digital-to-analog converter DAC. Analog-to-digital converter ADC2 has an identical structure and operates in a similar fashion.

Analog-to-digital converter ADC1 receives an input signal IN, which is the analog in-phase signal IA mentioned hereinbefore, and provides an output signal OUT, which is the digital in-phase signal ID mentioned hereinbefore. Similarly, analog-to-digital converter ADC2 receives an input signal, which is the analog quadrature signal QA mentioned hereinbefore, and provides an output signal, which is the digital quadrature signal QD mentioned hereinbefore.

Analog-to-digital converter ADC1 basically operates as follows. The summing circuit SUM provides an error signal ER, which is a linear combination of the input signal IN and a feedback signal FB. The noise shaping filter NSF integrates and filters the error signal ER. Accordingly, the noise shaping filter NSF provides an accumulated-and-filtered error signal AFE. The accumulated-and-filtered error signal AFE is time continuous and amplitude continuous. The accumulated-and-filtered error signal AFE has an amplitude that, at any given instant, may have any value among an infinite number of possible values. The amplitude of a signal is understood to be the instantaneous value of the signal.

The quantizer QNT receives the accumulated-and-filtered error signal AFE, the high-frequency clock signal CFH, and the signal strength indication SI. The quantizer QNT determines a digital output sample at each rising edge in the high-frequency clock signal CFH. Accordingly, the quantizer QNT provides a stream of digital output samples, which forms the output signal OUT. A digital output sample has a value that depends on the amplitude of the accumulated-and-filtered error signal AFE at the instant when the rising edge occurs at which the quantizer QNT determines the digital output sample. The digital output sample can have only one of the three following possible values: +1, 0, and −1.

Figure 4:
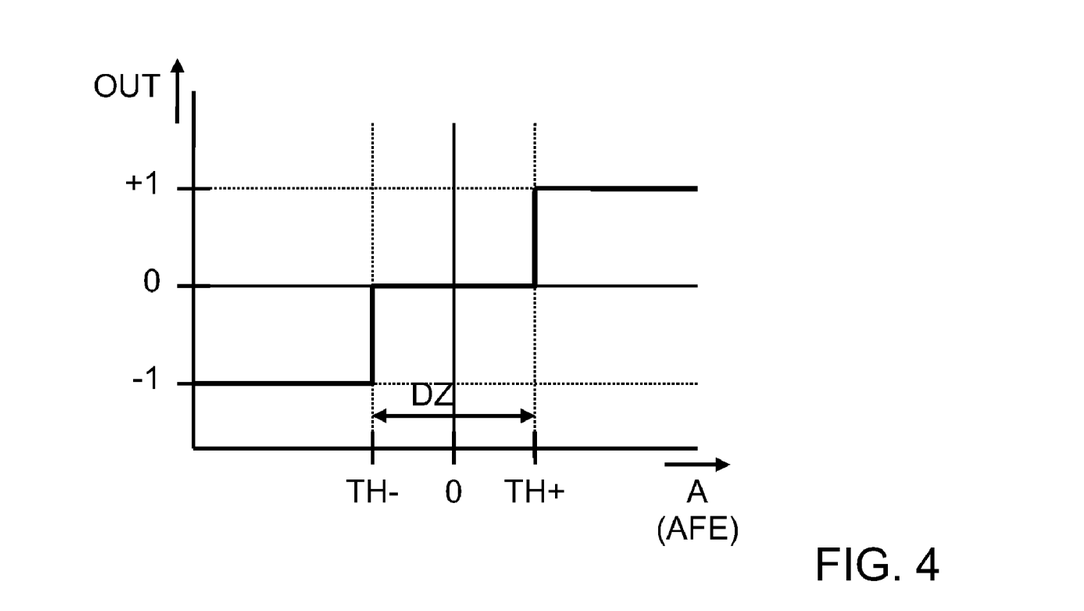
FIG. 4 is a graph that illustrates an input-output characteristic of a quantizer that forms part of the analog-to-digital converter.

FIG. 4 illustrates an input-output characteristic of the quantizer QNT. FIG. 4 is a graph with a horizontal axis and a vertical axis. The horizontal axis represents the amplitude A of the accumulated-and-filtered error signal AFE. The vertical axis represents the value of the digital output sample. The digital output sample has the value "−1" when the amplitude of the accumulated-and-filtered error signal AFE is below a negative threshold value TH−. The digital output sample has the value "+1" when the amplitude is above a positive threshold value TH+. The negative threshold value TH− and the positive threshold value TH+ preferably have the same magnitude and are of opposite sign.

The quantizer QNT has a dead zone DZ, which lies between the negative threshold value TH− and the positive threshold value TH+. The digital output sample has the value "0" when the amplitude of the accumulated-and-filtered error signal AFE is within the dead zone DZ. The dead zone DZ varies as a function of the signal strength indication SI, which the quantizer QNT receives. That is, a variation in the signal strength indication SI causes a variation in the magnitude of the negative threshold value TH− and the positive threshold value TH+, which are preferably identical. This will be explained in greater detail hereinafter.

Referring again to FIG. 4, the digital-to-analog converter DAC receives the stream of digital output samples, which forms the output signal OUT, and a delayed version of the high-frequency clock signal CFH, which will be referred to as delayed high-frequency clock signal CFD hereinafter. The digital-to-analog converter DAC converts a digital output sample into an analog feedback sample. Such a conversion takes place at each rising edge in the delayed high-frequency clock signal CFD. Accordingly, the digital-to-analog converter DAC provides a stream of analog feedback samples, which forms the feedback signal FB mentioned hereinbefore. Strictly speaking, the analog-to-digital converter ADC1 does not provide any analog feedback sample when the digital output sample is "0". That is, the feedback signal FB is momentarily interrupted, as it were, when the digital output signal OUT is "0".

The high-frequency clock signal CFH is delayed in order to compensate for a delay in the quantizer QNT. The quantizer QNT cannot immediately determine a digital output sample when a rising edge occurs in the high-frequency clock signal CFH. There is inevitably some delay between the rising edge and the availability of the digital output sample, which the quantizer QNT determines at the rising edge. A delay circuit, which delays the high-frequency clock signal CFH, compensates for this delay.

The summing circuit SUM, the noise shaping filter NSF, the quantizer QNT, and the digital-to-analog converter DAC constitute a feedback loop. The feedback loop seeks to maintain the accumulated-and-filtered error signal AFE within the dead zone DZ. This can be explained as follows.

Let it be assumed that, at a given rising edge in the high-frequency clock signal CFH, the amplitude of accumulated-and-filtered error signal AFE is above the positive threshold value TH+. In response, the quantizer QNT provides a digital output sample that has the value "+1". The digital-to-analog converter DAC converts the digital output sample into an analog feedback sample that has a negative sign. The noise shaping filter NSF will integrate this analog feedback sample, which will cause the accumulated-and-filtered error signal AFE to decrease in amplitude. The analog feedback sample counteracts the fact that the amplitude of the accumulated-and-filtered error signal AFE was above the positive threshold value TH+ at the aforementioned rising edge. The analog feedback sample pushes, as it were, the accumulated-and-filtered error signal AFE towards the dead zone DZ.

A similar feedback action occurs when the amplitude of the accumulated-and-filtered error signal AFE is below the negative threshold value TH−. The quantizer QNT provides a digital output sample that has the value "−1". The digital-to-analog converter DAC converts the digital output sample into an analog feedback sample that has a positive sign. This will cause the accumulated-and-filtered error signal AFE to increase in amplitude. The analog feedback sample counteracts the fact that the amplitude of the accumulated-and-filtered error signal AFE was below the negative threshold value TH−.

There is no feedback action for a digital output sample that has the value "0", which is the case when the amplitude of the accumulated-and-filtered error signal AFE is within the dead zone DZ. The digital-to-analog converter DAC does not provide an analog feedback sample in that case. It could also be said that the digital-to-analog converter DAC provides a zero (0) feedback sample in that case. The accumulated-and-filtered error signal AFE will evolve in a manner that is substantially determined by the input signal IN. There will be a feedback action as soon as the amplitude of the accumulated-and-filtered error signal AFE leaves the dead zone DZ.

Figure 5:
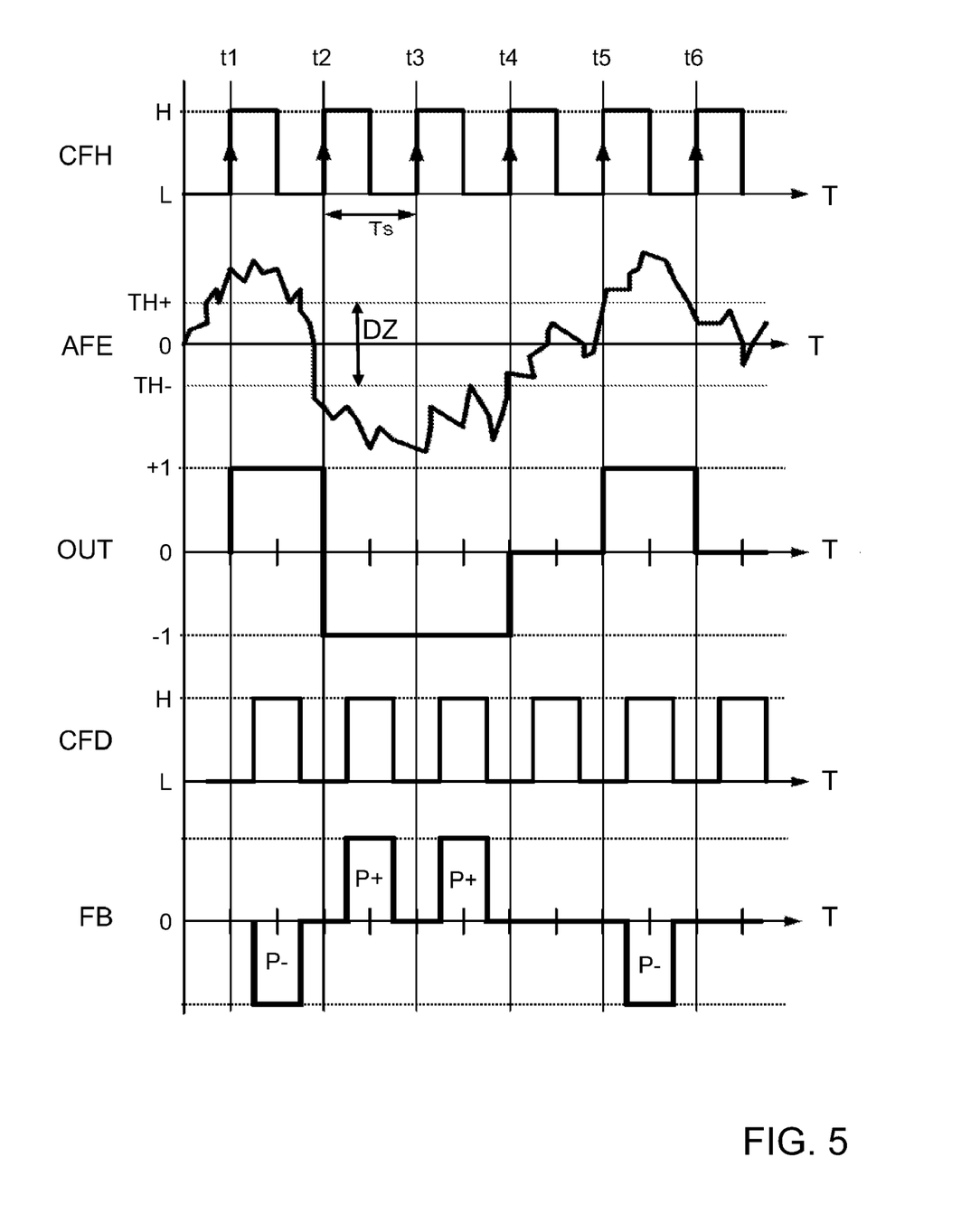
FIG. 5 is a composite graph that illustrates various signals within analog-to-digital converter.

FIG. 5 illustrates various signals within analog-to-digital converter ADC1: the high-frequency clock signal CFH, the accumulated-and-filtered error signal AFE, the output signal OUT, the delayed high-frequency clock signal CFD, and the feedback signal FB. FIG. 5 is a composite graph that comprises an identical horizontal axis, which represents time, for each of the aforementioned signals. Each of the aforementioned clock signals periodically switches between a low value L and a high value H. The high-frequency clock signal CFH switches from the low value L to the high value H at instants t1, t2, . . . , t6. This produces a rising edge at each of these instants. The composite axis has a vertical axis, which represents amplitude. The vertical axis is divided into various zones, one for each of the aforementioned signals.

There is a rising edge in the high-frequency clock signal CFH at instant t1. The amplitude of the accumulated-and-filtered error signal AFE is above the positive threshold value TH+ at instant t1. Consequently, the output signal OUT will have the value "+1" until a subsequent rising edge occurs at instant t2. A rising edge followed by a falling edge occurs in the delayed high-frequency clock signal CFD between the instant t1 and t2. The feedback signal FB comprises a negative feedback pulse P− between the aforementioned two edges in the delayed high-frequency clock signal CFD. The negative feedback pulse P− corresponds with the analog feedback sample of negative sign, which was mentioned hereinbefore. The noise shaping filter NSF illustrated in FIG. 3 receives the negative feedback pulse P− via the summing circuit SUM. Accordingly, the negative feedback pulse P− causes a change in the accumulated-and-filtered error signal AFE. The change corresponds with a response of the noise shaping filter NSF to the negative feedback pulse P−. Meanwhile, the input signal IN may also change the accumulated-and-filtered error signal AFE.

The value of the output signal OUT changes from "+1" to "−1" at instant t2 when the subsequent rising edge occurs in the high-frequency clock signal CFH. This is because the accumulated-and-filtered error signal AFE is below the negative threshold value TH− at that instant. A rising edge and subsequently a falling edge occur in the delayed high-frequency clock signal CFD following instant t2. The feedback signal FB comprises a positive feedback pulse P+ between the aforementioned two edges. This is because the output signal OUT has the value "−1". The positive feedback pulse P+ will cause a change in the accumulated-and-filtered error signal AFE. Meanwhile, the input signal IN may also change the accumulated-and-filtered error signal AFE.

There is a rising edge in the high-frequency clock signal CFH at instant t4. The amplitude of the accumulated-and-filtered error signal AFE is within the dead zone DZ at instant t4. Consequently, the output signal OUT will have the value "0" until a subsequent rising edge occurs at instant t5. A rising edge followed by a falling edge occurs in the delayed high-frequency clock signal CFD between the instants t4 and t5. Nonetheless, the feedback signal FB does not comprise any feedback pulse between these instants. The accumulated-and-filtered error signal AFE will change is a function of the input signal IN only. The feedback loop is momentarily opened, as it were, between instants t4 and t5. There is a pause in the feedback action. This is an important characteristic of analog-to-digital converter ADC1.

Analog-to-digital converter ADC1 has a signal-to-noise ratio that depends, amongst other things, on jitter in the high-frequency clock signal CFH. Jitter is a form of time imprecision. Rising edges and falling edges in the high-frequency clock signal CFH do not exactly occur on a fixed time grid. An edge may occur somewhat sooner or somewhat later than desired in a random fashion. This phenomenon can also be seen as phase noise, will be referred to as clock jitter hereinafter. Clock jitter causes random errors in the feedback signal FB and, therefore, random errors in the output signal OUT. That is, analog-to-digital converter ADC1 translates, as it were, clock jitter into noise in the output signal OUT.

The dead zone DZ of the quantizer QNT makes analog-to-digital converter ADC1 relatively insensitive to clock jitter, which allows a signal-to-noise ratio improvement. This can be explained as follows. Due to the dead zone DZ, there will be edges in the high-frequency clock signal CFH that do not cause any feedback action. The rising edge at instant t4 in FIG. 5 is an example. Due to the dead zone DZ, only a percentage of the edges in the high-frequency clock signal CFH will cause a feedback action. The edges that occur when the output signal OUT has the value "0" do not cause any feedback action. Consequently, only a percentage of the edges will cause a random error in the output signal OUT. This makes analog-to-digital converter ADC1 relatively insensitive to clock jitter.

Figure 6:
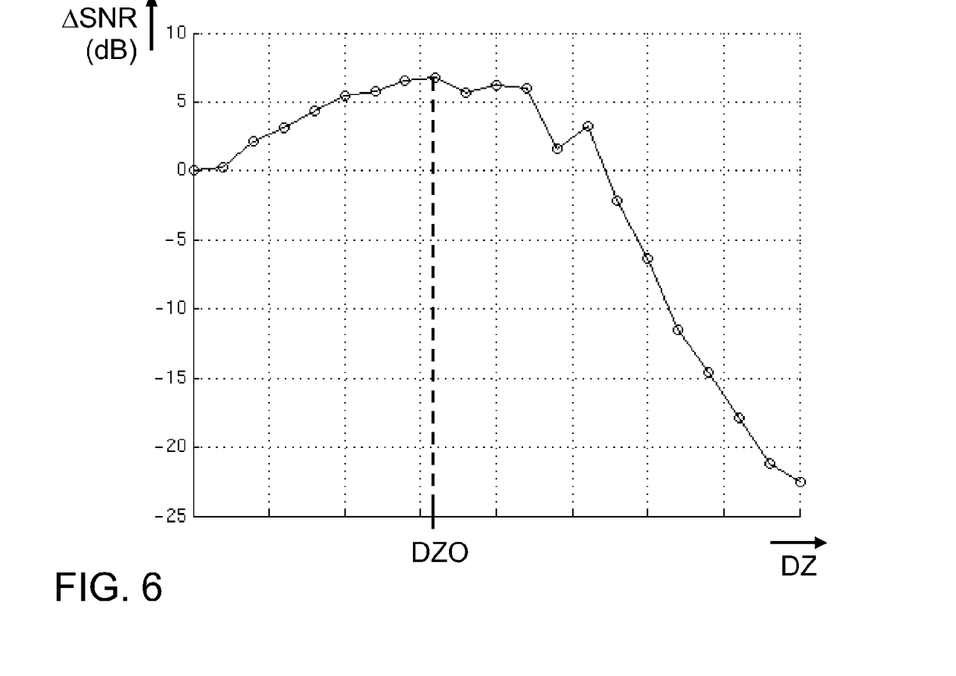
FIG. 6 is a graph that illustrates a signal-to-noise ratio curve of the analog-to-digital converter.

FIG. 6 illustrates a signal-to-noise ratio curve of analog-to-digital converter ADC. FIG. 6 is a graph that has a horizontal axis and a vertical axis. The horizontal axis represents the dead zone DZ in scalar units. The vertical axis represents the signal-to-noise ratio of analog-to-digital converter ADC in decibel (dB) units. 0 dB is the signal-to-noise ratio that is obtained when there is no dead zone DZ. This case corresponds with a conventional Sigma Delta analog-to-digital converter ADC that provides a two-level output signal. The vertical axis thus represents a signal-to-noise ratio improvement $\Delta$SNR.

The signal-to-noise ratio curve of FIG. 6 illustrates that the signal-to-noise ratio of analog-to-digital converter ADC varies as a function of the dead zone DZ. Starting from 0 on the horizontal axis, the signal-to-noise ratio increases as the dead zone DZ increases, which corresponds to moving to the right on the horizontal axis. The signal-to-noise ratio has a maximum value at a particular dead zone DZ. This particular dead zone DZ is referred to as the optimum dead zone DZO hereinafter. Starting from the optimum dead zone DZO, the signal-to-noise ratio first decreases to a relatively small extent as the dead zone DZ further increases. This corresponds with moving further to the right on the horizontal axis. While moving further, a relatively sharp decrease in signal-to-noise ratio can be observed.

The existence of an optimum dead zone DZO can be explained as follows. The wider the dead zone DZ is, the smaller the percentage of edges in the high-frequency clock signal CFH is that influences the output signal OUT through feedback. Consequently, the wider the dead zone DZ is, the less sensitive analog-to-digital converter ADC is to clock jitter. This phenomenon explains the increase of the signal-to-noise ratio when moving on the horizontal axis from 0 to the optimum dead zone DZO.

However, there is another phenomenon. The dead zone DZ causes the feedback loop to be inoperative for a percentage of time, as explained hereinbefore. The wider the dead zone DZ is, the greater the percentage of time during which the feedback loop is inoperative. An error is introduced when the feedback loop is inoperative. A significant accumulation of errors will occur when the feedback loop is inoperative most of the time. This may cause instability. The output signal OUT no longer reflects the input signal IN which sufficient precision, but rather reacts to the significant accumulation of errors. Such instability degrades the signal-to-noise ratio.

The optimum dead zone DZO can be seen as a best compromise between the two aforementioned phenomena: widening the dead zone DZ reduces sensitivity to clock jitter, on one hand, but makes the feedback loop less stable, on the other hand. The first mentioned phenomenon has a beneficial effect on the signal-to-noise ratio, whereas the last mentioned phenomenon has an adverse effect on the signal-to-noise ratio.

The optimum dead zone DZO depends on the magnitude of the input signal IN of analog-to-digital converter ADC. Let it be assumed that the magnitude of input signal IN is relatively small. In that case, the dead zone DZ needs to be relatively narrow in order to prevent that the feedback loop is inoperative most of the time, which could cause instability. Conversely, let it not be assumed that the magnitude of the input signal IN is relatively large. In that case, the dead zone DZ can be relatively wide. The relatively large magnitude of the input signal IN causes the feedback loop to be operative for a sufficient percentage of time in terms of stability.

Figure 7:
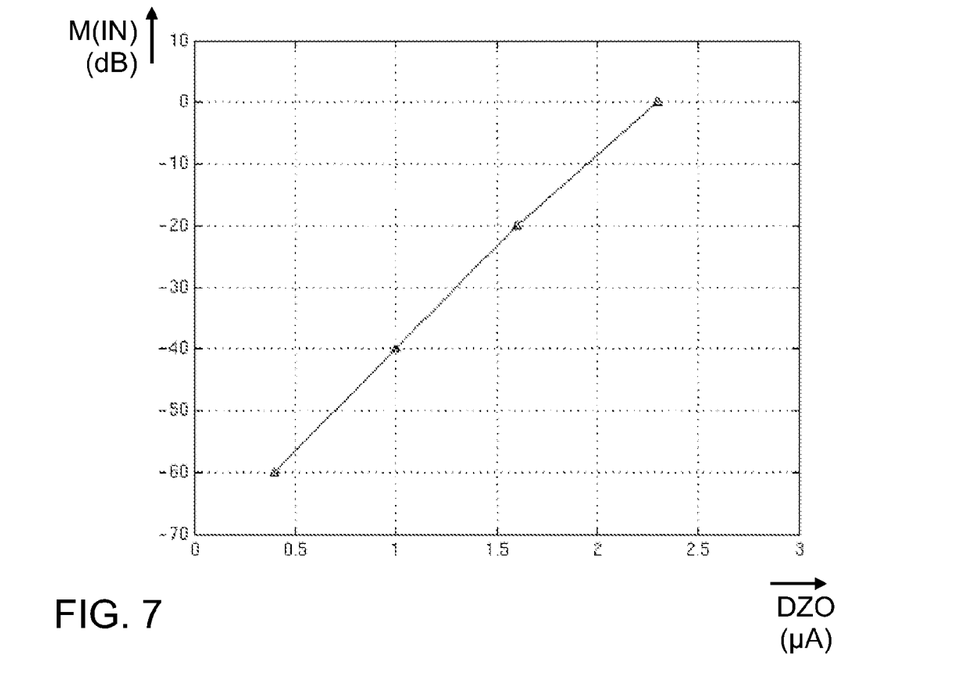
FIG. 7 is a graph that illustrates an optimum dead zone curve.

FIG. 7 illustrates an optimum dead zone DZO curve. FIG. 7 as a graph that has a horizontal axis and a vertical axis. The horizontal axis represents the dead zone DZ in units of micro ampere $\mu$A, by way of example. These are scalar units. The vertical axis represents the magnitude of the input signal IN in decibel (dB) units. 0 dB corresponds with a full-scale magnitude. The full-scale magnitude is the maximum magnitude that analog-to-digital converter ADC can handle.

The optimum dead zone DZO curve illustrates that the optimum dead zone DZO varies with the magnitude of the input signal IN according to a logarithmic function. The optimum dead zone DZO curve projects a variation of 10 dB on the vertical axis onto a substantially fixed scalar-unit variation on the horizontal axis. In effect, the optimum dead zone DZO curve resembles a typical received signal strength curve. Many receivers comprise a circuit that produces a received signal strength indication in accordance with a logarithmic function: a given signal-strength variation in decibel (dB) units produces a substantially fixed scalar-unit variation in the received signal strength indication.

Figure 8:
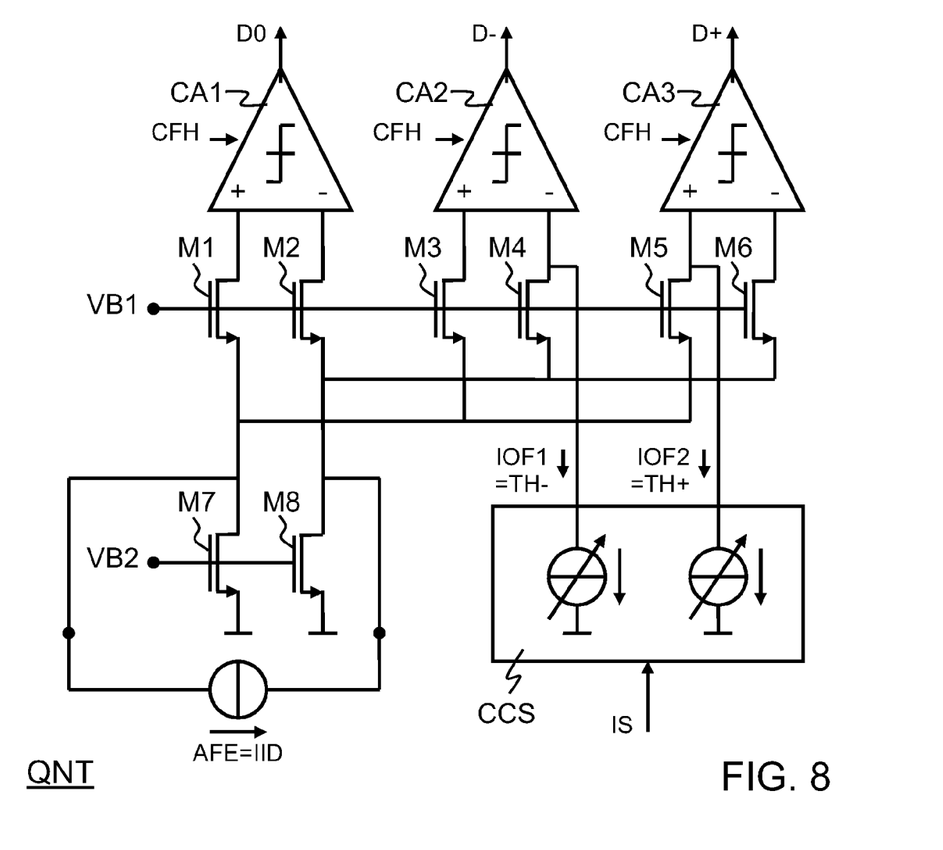
FIG. 8 is a block diagram that illustrates the quantizer of the analog-to-digital converter.

FIG. 8 illustrates the quantizer QNT. The quantizer QNT comprises three comparators CA1, CA2, CA3, various transistors M1, M2, . . . , M8 of the field effect type, and a controllable current source CCS. The quantizer QNT receives a differential input current IID, which is the accumulated-and-filtered error signal AFE. The three comparators CA1, CA2, CA3 each receive the high-frequency clock signal CFH. The controllable current source CCS receives the signal strength indication SI from the quadrature-signal processing circuit QSP illustrated in FIG. 2.

Transistors M1, M2, . . . , M6 are arranged in a so-called cascode configuration and operate as current followers. Each of these transistors has a drain that provides an output current, which is substantially identical to an input current at a source of the transistor. Each of these transistors has a gate that receives a bias voltage VB1. Transistors M7, M8, which receive a bias voltage VB2, are arranged as bias current sources.

The quantizer QNT operates follows. Transistors M1, M2, . . . , M6 split the differential input current IID of the quantizer QNT into three portions that are substantially identical. Consequently, transistors M1, M2, . . . , M6 apply one third of the differential input current IID of the quantizer QNT to each of the three comparators CA1, CA2, CA3.

Comparator CA1 receives a differential input current, which is substantially equal to one third of the differential input current IID of the quantizer QNT. Comparator CA2 receives a differential input current that is substantially equal to one third of the differential input current IID of the quantizer QNT minus a first offset current IOF1. That is, comparator CA2 receives a negatively offsetted portion of the differential input current IID of the quantizer QNT. Comparator CA3 receives a differential input current that is substantially equal to one third of the differential input current IID plus a second offset current IOF2. That is, comparator CA3 receives a positively offsetted portion of the differential input current IID of the quantizer QNT.

The first offset current IOF1 and the second offset current IOF2 create the dead zone DZ in the quantizer QNT. More specifically, the first offset current IOF1 defines the negative threshold value TH−. The second offset current IOF2 defines a positive threshold value TH+. The first offset current IOF1 and a second offset current IOF2 are preferably identical. In that case, the dead zone DZ is centered on 0, which FIG. 4 illustrates.

The controllable current source CCS adjusts the aforementioned offset currents IOF1, IOF2 as a function of the signal strength indication SI. Accordingly, the dead zone DZ varies as a function of the magnitude of the input signal IN of analog-to-digital converter ADC in accordance with the optimum dead zone DZO curve, which FIG. 7 illustrates.

Comparator CA1 establishes a binary output sample at each rising edge in the high-frequency clock signal CFH. Let it be assumed that the differential input current IID of comparator has a positive sign at a rising edge. In that case, the binary output sample has a high value H. Conversely, the binary output sample has a low value L is the differential input current IID has a negative sign. Accordingly, comparator CA1 provides a stream of binary output samples that constitute a zero detection signal D0.

Comparators CA2 and CA3 operate in a similar fashion. Comparator CA2, which receives the negatively offsetted portion of the differential input current IID of the quantizer QNT, provides a stream of binary output samples that constitutes a negative-threshold detection signal D−. Comparator CA3, which receives a positively offsetted portion of the differential input current IID of the quantizer QNT, a stream of binary output samples that constitute a positive-threshold detection signal D+.

Figure 9:
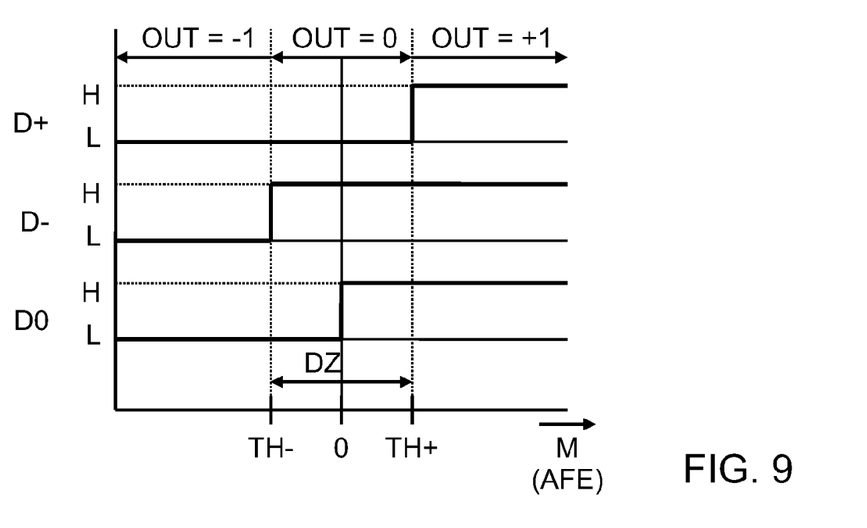
FIG. 9 is a graph that illustrates a quantization characteristic that the quantizer provides.

FIG. 9 illustrates a quantization characteristic that the quantizer QNT provides. FIG. 9 is a composite graph with a horizontal axis and a vertical axis. The horizontal axis represents the amplitude of the accumulated-and-filtered error signal AFE, which constitutes the differential input current IID of the quantizer QNT. The vertical axis is divided into three zones that represent the values of the zero detection signal D0, the negative-threshold detection signal D−, and the positive-threshold detection signal D+, respectively.

The three aforementioned detection signals D0, D−, D+ each have the low value L when the amplitude of the accumulated-and-filtered error signal AFE is below the negative threshold value TH−. The output signal OUT illustrated in FIG. 3 has the value "−1" in that case. The negative-threshold detection signal D− has the high value H, whereas the positive-threshold detection signal D+ has the low value L, when the amplitude of the accumulated-and-filtered error signal AFE is within the dead zone DZ. The output signal OUT has the value "0" in that case. The three aforementioned detection signals D0, D−, D+ each have the high value H when the amplitude of the accumulated-and-filtered error signal AFE is above the positive threshold value TH+. The output signal OUT illustrated in FIG. 3 has the value "+1" in that case.

Figure 10:
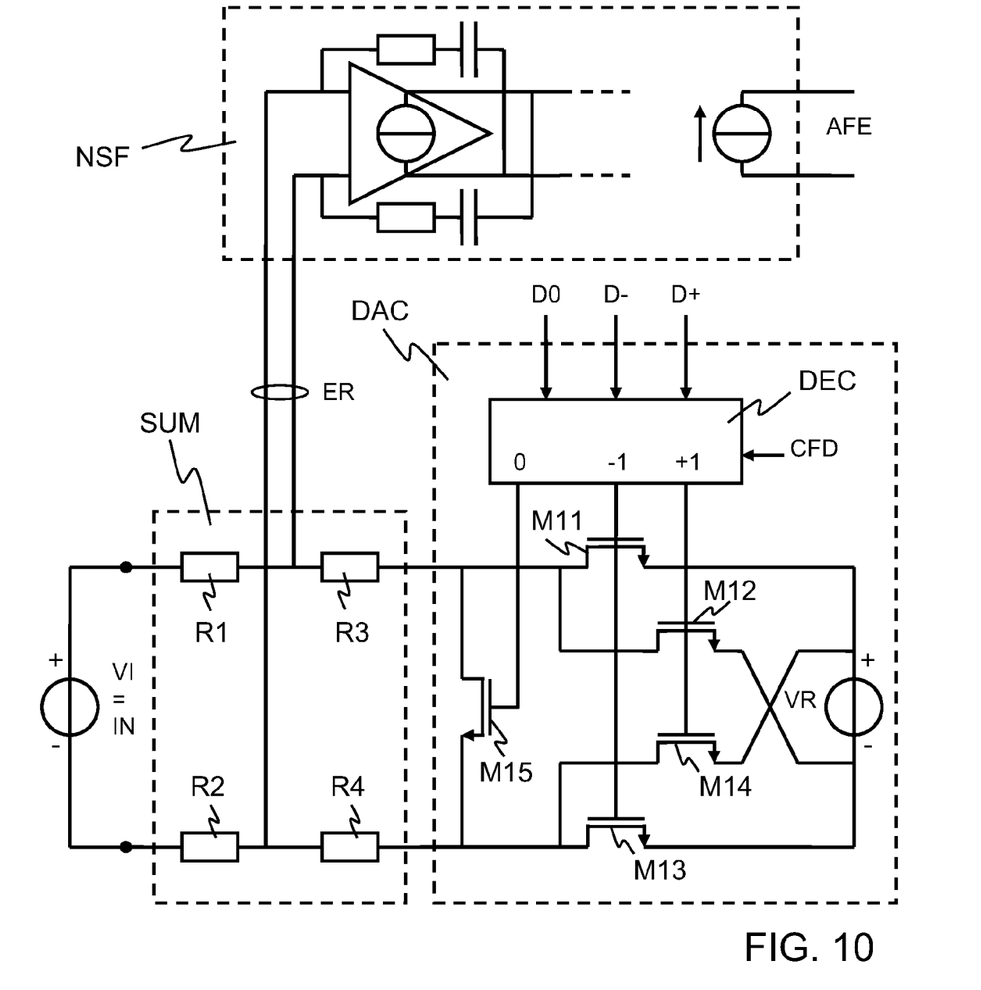
FIG. 10 is a block diagram that illustrates details of a digital-to-analog converter and a summing circuit, which form part of the analog-to-digital converter.

FIG. 10 illustrates details of the digital-to-analog converter DAC and the summing circuit SUM. The digital-to-analog converter DAC comprises a decoder DEC, and five transistors M11, M12, . . . , M15, which are of the field effect type. The digital-to-analog converter DAC further comprises a reference voltage source, which provides a reference voltage VR. The digital-to-analog converter DAC receives the aforementioned detection signals from the quantizer QNT and the delayed high-frequency clock signal CFD.

The summing circuit SUM comprises four resistances R1, R2, R3, R4. The summing circuit SUM receives a differential input voltage VI, which is the input signal IN of analog-to-digital converter ADC illustrated in FIG. 3. FIG. 10 further illustrates that the noise shaping filter NSF has a differential structure and comprises a differential transconductance amplifier. The error signal ER is in the form of a differential current, which the differential transconductance amplifier of the noise shaping filter NSF receives.

The digital-to-analog converter DAC operates follows. The five transistors M11, M12, . . . , M15 operate as switches under the control of the decoder DEC. The decoder DEC controls the five transistors M11, M12, . . . , M15 in dependence on the delayed high-frequency clock signal CFD and the detection signals D0, D−, D+ from the quantizer QNT. The detection signals D0, D−, D+ indicate the value of the output signal OUT, which can be "−1", "0", or "+1".

Figure 11:
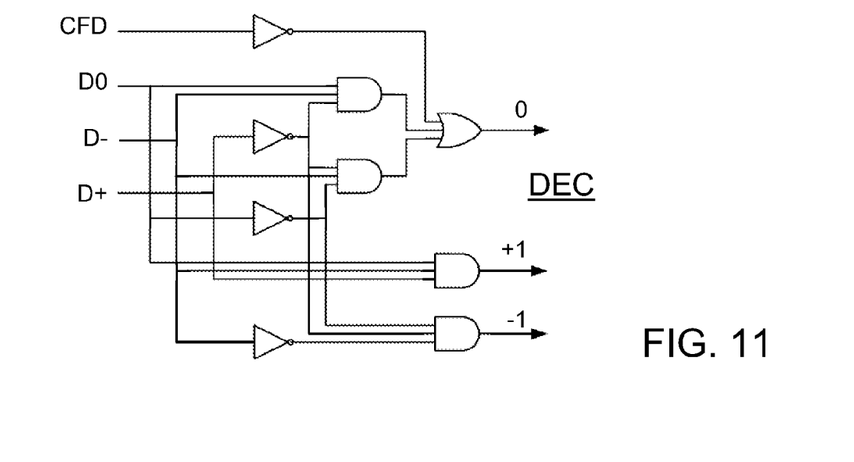
FIG. 11 is a circuit diagram that illustrates details of the decoder.

FIG. 11 illustrates details of the decoder DEC in the form of a circuit diagram. The decoder DEC comprises various elementary logic circuits, such as, inverters, AND gates, and an OR gate. Any person of ordinary skill will readily understand the circuit diagram that FIG. 11 provides.

Let it be assumed until further notice that the delayed high-frequency clock signal CFD has the high value H. Let it further be assumed that the output signal OUT has the value "−1". In that case, the decoder DEC causes transistors M11 and M13 to constitute short circuits and causes the other transistors M12, M14, M15 to constitute open circuits. The summing circuit SUM receives the reference voltage VR without any sign inversion; the summing circuit SUM receives "+VR". This will cause a positive feedback current in the error signal ER.

Let it now be assumed that the output signal OUT has the value "+1" and that the delayed high-frequency clock signal CFD has the high value H. In that case, the decoder DEC causes transistors M12 and M14 to constitute short circuits and causes the other transistors M11, M13, M15 to constitute open circuits. The summing circuit SUM receives a sign-inverted version of reference voltage VR; the summing circuit SUM receives "−VR". This will cause a negative feedback current in the error signal ER.

Let it now be assumed that the output signal OUT has the value "0". In that case, the decoder DEC causes transistor M15 to constitute a short circuit and causes the other transistors M11, M12, M13, M14 to constitute open circuits. The summing circuit SUM receives a zero voltage from the digital-to-analog converter DAC. No feedback current will occur in the error signal ER.

The decoder DEC causes transistor M15 to constitute a short circuit when the delayed high-frequency clock signal CFD has the low value L, irrespective of the value of the output signal OUT. The summing circuit SUM receives a zero voltage when transistor M15 constitutes a short circuit. Consequently, no feedback current will occur in the error signal ER when the delayed high-frequency clock signal CFD has the low value L. A feedback current can occur only when the delayed high-frequency clock signal CFD has the high value H. FIG. 5 illustrates the same. There is a systematic return to zero in the feedback signal FB between two consecutive feedback actions.

The systematic return to zero in the feedback signal FB allows a linear feedback characteristic and, therefore, distortion free operation of analog-to-digital converter ADC1. This can be explained with reference to FIG. 5, which illustrates various feedback pulses in the feedback signal FB. Each feedback pulse has a surface that depends on the shape and the duration of the feedback pulse. The surface of the feedback pulse represents an amount of energy. The amount of energy of each feedback pulse should be the same in order to obtain a linear feedback characteristic.

The following phenomenon may give rise to a nonlinear feedback characteristic. A signal transition cannot be instantaneous in practice; it takes a signal some time to change from one value to another value. Let it be assumed that each feedback pulse has a duration that is equal to a full period of the high-frequency clock signal CFH. Consequently, there will be no signal transitions in case a feedback pulse is preceded by a feedback pulse of similar sign and followed by a feedback pulse of similar sign. Such a feedback pulse will have a higher energy than a feedback pulse that comprises a signal transition because, for example, the last-mentioned feedback pulse is preceded by a feedback pulse of opposite sign or is followed by feedback pulse of opposite sign, or both. The energy of a feedback pulse is context dependent if feedback pulses succeed each other in a seamless fashion. This will cause a feedback characteristic that is nonlinear to a certain extent.

The systematic return to zero between two consecutive pulses in the feedback signal FB, which FIG. 5 illustrates, causes each feedback pulse to have two signal transitions. A feedback pulse always has a rising edge followed by a falling edge, even when the feedback pulse is preceded by a feedback pulse of similar sign or followed by a feedback pulse of similar sign, or both. The energy of the feedback pulse is context independent. This allows a linear feedback characteristic and, therefore, distortion free operation of analog-to-digital converter ADC1.

It should be noted that the output signal OUT of analog-to-digital converter ADC1 may be presented in numerous different formats. The same applies to analog-to-digital converter ADC2. For example, analog-to-digital converter ADC1 may comprise an output coder that provides a two-bit output signal OUT on the basis of the three detection signals that the quantizer QNT provides. A two-bit output sample of which both bits are equal to "0" may represent the value "0". The two-bit output sample represents the value "+1" is one of the two bits is equal to "1" and represents the value "−1" if the other bit is equal to "1".

It should further be noted that the two decimation filters DCF1, DCF2 which receive the output signals of analog-to-digital converters ADC1, ADC2, respectively, can be relatively simple. A decimation filter generally carries out the following operations: addition, subtraction, and multiplication. These operations can be carried out with relatively simple hardware or software, whichever applies, because the two decimation filters DCF1, DCF2 receive a three-level input signal IN that may have one of the following values only at any given instant: "0", "+1" or "−1". Multiplying a filter coefficient value with "−1" is as simple as multiplying with "+1". Differentiating between the two aforementioned multiplications merely involves a sign inversion.

CONCLUDING REMARKS

The detailed description hereinbefore with reference to the drawings illustrates the following characteristics, which are cited in various independent claims. An analog-to-digital converter (ADC1) of the Sigma Delta type provides a stream of digital output samples (OUT) in response to an analog input signal (IN). The analog-to-digital converter (ADC1) comprises a quantizer (QNT) that has a dead zone (DZ). The quantizer (QNT) provides a digital output sample that has a neutral value (0) when the quantizer (QNT) receives an input signal whose amplitude is within the dead zone (DZ). A feedback path (DAC) within the analog-to-digital converter (ADC1) provides a feedback action only in response to a digital output sample that has a value (+1, −1) other than the neutral value (0).

The detailed description hereinbefore further illustrates various optional characteristics, which are cited in the dependent claims. These characteristics may be applied to advantage in combination with the aforementioned characteristics. Various optional characteristics are highlighted in the following paragraphs. Each paragraph corresponds with a particular dependent claim.

The quantizer (QNT) varies the dead zone (DZ) in dependence on a signal strength indication (SI), which indicates the magnitude of the analog input signal (IN). This characteristic allows a signal-to-noise ratio improvement in a relatively wide range of input signal magnitudes.

The quantizer (QNT) varies the dead zone (DZ) in dependence on the magnitude of the analog input signal (IN) in accordance with a logarithmic function. This characteristic allows an optimum signal-to-noise ratio in a relatively wide range of input signal magnitudes.

The feedback path (DAC) provides feedback pulses (P+, P−) with a systematic return to zero between two consecutive feedback pulses (P+, P−). This characteristic allows distortion free operation of the analog-to-digital converter (ADC1).

The feedback path (DAC) provides the feedback pulses (P+, P−) in synchronization with a delayed version of a clock signal (CFH) that the quantizer (QNT) receives. This characteristic contributes to distortion free operation.

The quantizer (QNT) provides three-level digital output samples, which may either have a single positive value (+1), a single negative value (−1), or the neutral value (0). This characteristic allows filtering the stream of digital output samples (OUT) with relatively simple hardware or software.

The aforementioned characteristics can be implemented in numerous different manners. In order to illustrate this, some alternatives are briefly indicated.

A digital output sample may have any number of possible values. That is, the stream of digital output samples may constitute an M-level signal, M being an odd integer greater than 1. The detailed description merely provides an example in which M=3. As another example, an analog-to-digital converter in accordance with the invention may comprise a quantizer with dead zone that provides 5 different output values: "+2", "+1", "0", "−1" and "−2". In that case, M=5.

The quantizer can be implemented in numerous different manners. The detailed description merely provides an example that comprises current-driven comparators. As another example, the quantizer may comprise voltage-driven comparators. Referring to FIG. 8, it should be noted that comparator CA1 may be deleted for reasons of economy. A three-level signal can be represented by means of two bits. Consequently, two comparators are sufficient to establish the three-level signal.

The feedback path can be implemented in numerous different manners. The detailed description merely provides an example that comprises a voltage-based digital-to-analog converter with switches in the form of field-effect transistors. As another example, the feedback path may comprise a current-based digital-to-analog converter with switches in the form of bipolar transistors.

There are numerous manners to control the dead zone in dependence on a signal strength indication. The detailed description merely provides an example in which the two analog-to-digital converters ADC1, ADC2 receive the signal strength indication SI from the quadrature-signal processing circuit QSP. Alternatively, the processing-and-control circuit PCC, which is illustrated in FIG. 1, may control the dead zone by means of the control signals CS that are applied to the receiver circuit RXC. In such a variant, the dead zone control passes via the processing-and-control circuit PCC, which is suitably programmed to that effect.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. An analog-to-digital converter of the Sigma Delta type, which provides a stream of digital output samples in response to an analog input signal, the analog-to-digital converter comprising:
   a quantizer that has a dead zone, the quantizer being arranged to provide a digital output sample that has a neutral value when the quantizer receives an input signal IN whose amplitude is within the dead zone; and
   a feedback path arranged to provide a feedback action only in response to a digital output sample that has a value other than the neutral value.

2. An analog-to-digital converter according to claim 1, the quantizer being arranged to vary the dead zone in dependence on a signal strength indication, which indicates the magnitude of the analog input signal.

3. An analog-to-digital converter according to claim 2, the quantizer being arranged to vary the dead zone in dependence on the magnitude of the analog input signal in accordance with a logarithmic function.

4. An analog-to-digital converter according to claim 1, the feedback path being arranged to provide feedback pulses with a systematic return to zero between two consecutive feedback pulses.

5. An analog-to-digital converter according to claim 4, the feedback path being arranged to provide the feedback pulses in synchronization with a delayed version of a clock signal that the quantizer receives.

6. An analog-to-digital converter according to claim 1, the quantizer being arranged to provide three-level digital output samples, which may either have a single positive value, a single negative value, or the neutral value.

7. A receiver comprising a front-end circuit-arranged to process a radiofrequency signal so as to obtain an analog intermediate signal, and an analog-to-digital converter according to claim 1 coupled to convert the analog intermediate signal into a digital intermediate signal.

8. A receiver as claimed in claim 7, the receiver comprising a digital intermediate signal processing circuit arranged to provide a signal strength indication, which indicates the magnitude of the analog intermediate signal, the analog-to-digital converter being arranged to vary the dead zone in dependence on the signal strength indication.

9. A method of controlling an analog-to-digital converter according to claim 1, the method comprising:
   a dead zone control step in which the dead zone of the analog-to-digital converter is controlled in dependence on a signal strength indication, which indicates the magnitude of the analog input signal of the analog-to-digital converter.

* * * * *